(12) United States Patent
Bateman et al.

(10) Patent No.: US 9,285,889 B2
(45) Date of Patent: Mar. 15, 2016

(54) ELECTRODE ARRANGEMENT FOR A KEYBOARD PROXIMITY AND TRACKING SENSOR

(71) Applicant: INTEL CORPORATION, Santa Clara, CA (US)

(72) Inventors: Steven S. Bateman, Portland, OR (US); James M. Okuley, Portland, OR (US); Ron D. Egger, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 13/709,921

(22) Filed: Dec. 10, 2012

(65) Prior Publication Data
US 2014/0160027 A1    Jun. 12, 2014

(51) Int. Cl.
| | |
|---|---|
| *G06F 3/02* | (2006.01) |
| *G09G 5/00* | (2006.01) |
| *G06F 3/01* | (2006.01) |
| *G06F 3/041* | (2006.01) |
| *H03K 17/96* | (2006.01) |

(52) U.S. Cl.
CPC .............. *G06F 3/0202* (2013.01); *G06F 3/017* (2013.01); *G06F 3/0213* (2013.01); *G06F 3/041* (2013.01); *H03K 17/9622* (2013.01); *H03K 2217/960755* (2013.01); *H03K 2217/960775* (2013.01)

(58) Field of Classification Search
CPC ....... G06F 3/017; G06F 3/0202; G06F 3/046; H03K 2217/960775
USPC .......................................................... 345/168
See application file for complete search history.

(56) References Cited

U.S. PATENT DOCUMENTS

| | | | |
|---|---|---|---|
| 2004/0243747 A1* | 12/2004 | Rekimoto | ........................ 710/72 |
| 2005/0088416 A1 | 4/2005 | Hollingsworth | |
| 2007/0198866 A1 | 8/2007 | Martlik | |
| 2007/0216424 A1 | 9/2007 | Sieh et al. | |
| 2008/0042978 A1* | 2/2008 | Perez-Noguera | ............. 345/168 |

(Continued)

FOREIGN PATENT DOCUMENTS

| | | |
|---|---|---|
| CN | 1524211 A | 8/2004 |
| WO | WO 2011-098280 | 8/2011 |

(Continued)

OTHER PUBLICATIONS

International Search Report and Written Opinion for Application PCT/US2013/061526 dated Jan. 24, 2014.

(Continued)

*Primary Examiner* — Charles Hicks
*Assistant Examiner* — Brent D Castiaux
(74) *Attorney, Agent, or Firm* — KED & Associates LLP

(57) ABSTRACT

A keyboard assembly includes a transmitter electrode and one or more receiver electrodes that are used to generate an electric field above one or more keys of the assembly. The first electrode is located on a first level of a keyboard assembly and the second electrode is located on a second level of the keyboard assembly. The first level may correspond to a support plate of the assembly and the second level may correspond to a surface of a printed circuit board to which the second electrode is coupled. Alternatively, the first and second levels may correspond to different sides of a frame of the keyboard assembly. Disturbances in the electric field may be detected to perform a control operation of a host device that includes or is coupled to the keyboard assembly.

14 Claims, 11 Drawing Sheets

(56) References Cited

U.S. PATENT DOCUMENTS

| | | |
|---|---|---|
| 2008/0167088 A1 | 7/2008 | Rabu et al. |
| 2010/0013775 A1* | 1/2010 | Son ............................. 345/168 |
| 2012/0038496 A1* | 2/2012 | Edwards ........................ 341/34 |
| 2012/0044562 A1 | 2/2012 | Hong et al. |
| 2013/0050092 A1* | 2/2013 | Ivanov ........................ 345/168 |
| 2014/0300579 A1 | 10/2014 | Rekimoto |
| 2015/0054787 A1 | 2/2015 | Rekimoto |

FOREIGN PATENT DOCUMENTS

| | | | |
|---|---|---|---|
| WO | WO 2011/098280 A1 * | 8/2011 | |
| WO | WO 2011/098281 A2 | 8/2011 | |
| WO | 2014/092837 A1 | 6/2014 | |

OTHER PUBLICATIONS

Taiwanese Office Action for Application 102143226 dated Sep. 2, 2015.

Extended European Search Report for Application 11878831.4 dated Jul. 10, 2015.

English language translation of Japanese Office Action for Application 2014-552408 dated Jun. 23, 2015.

* cited by examiner

ELECTRODE ARRANGEMENT FOR A KEYBOARD PROXIMITY AND TRACKING SENSOR

FIELD

One or more embodiments described herein relate to electric field detection.

BACKGROUND

An electric field proximity sensor operates by detecting disturbances in an electric field. The field is generated by a transmitting electrode and a receiving electrode, and the range of the sensor is determined based on a separation distance between them. When an object is present in or moves through the field, a corresponding field disturbance is detected which, in turn, allows the object to be tracked. The ability of this type of sensor to detect through non-conductive material allows the sensor to be completely hidden and makes it suitable for various home automation, automotive and gaming applications.

DETAILED DESCRIPTION

Figure 1:
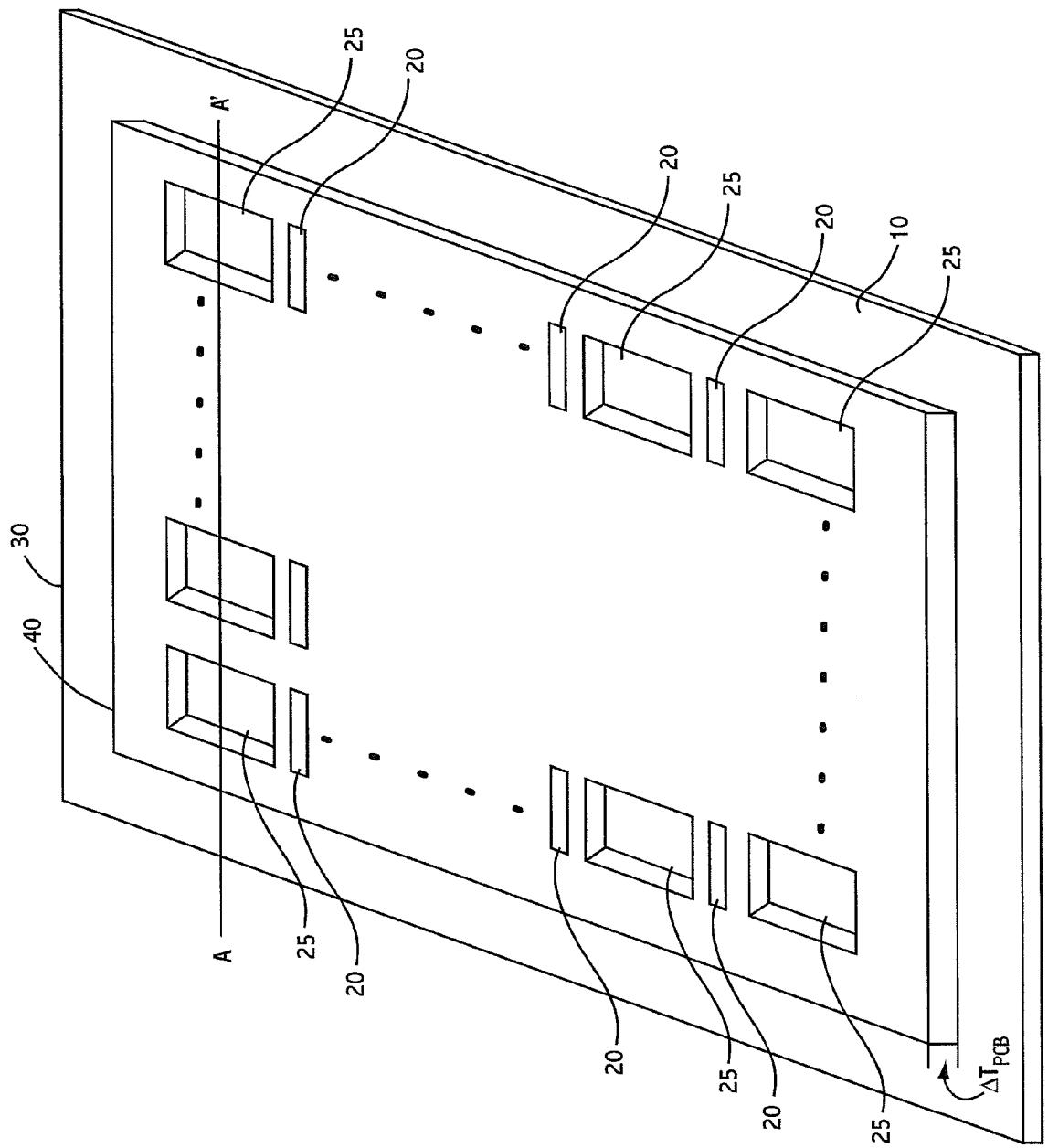
FIG. 1 shows an embodiment of an electric field sensor for a keyboard.

FIG. 1 shows one embodiment of an electric field (E-field) proximity sensor that is incorporated into a keyboard. The keyboard may be included in a notebook or laptop computer, a smart phone, or another type of electronic device that has entry keys. The keyboard may be one that includes alphanumeric letters, a numeric keypad, or another type of input device that has one or more keys or buttons for executing a function and/or entering data into a device. For a desktop implementation, the sensor may be incorporated into a keyboard coupled to, for example, a housing of a central processing unit of the computer.

The sensor may include at least one transmitter electrode 10 and a predetermined number of receiver electrodes 20. In order to integrate the sensor into the keyboard structure, the transmitter electrode 10 is formed on or by the metal support plate 30 of the keyboard and the receiver electrodes 20 are mounted at (or on) a top surface of a printed circuit board 40. The transmitter electrode 10 may be supported by the support plate 30. The receiver electrodes may be supported by the printed circuit board 40. In FIG. 1, the transmitter electrode 10 is shown to correspond to the entire metal support plate of the keyboard.

Figure 2:
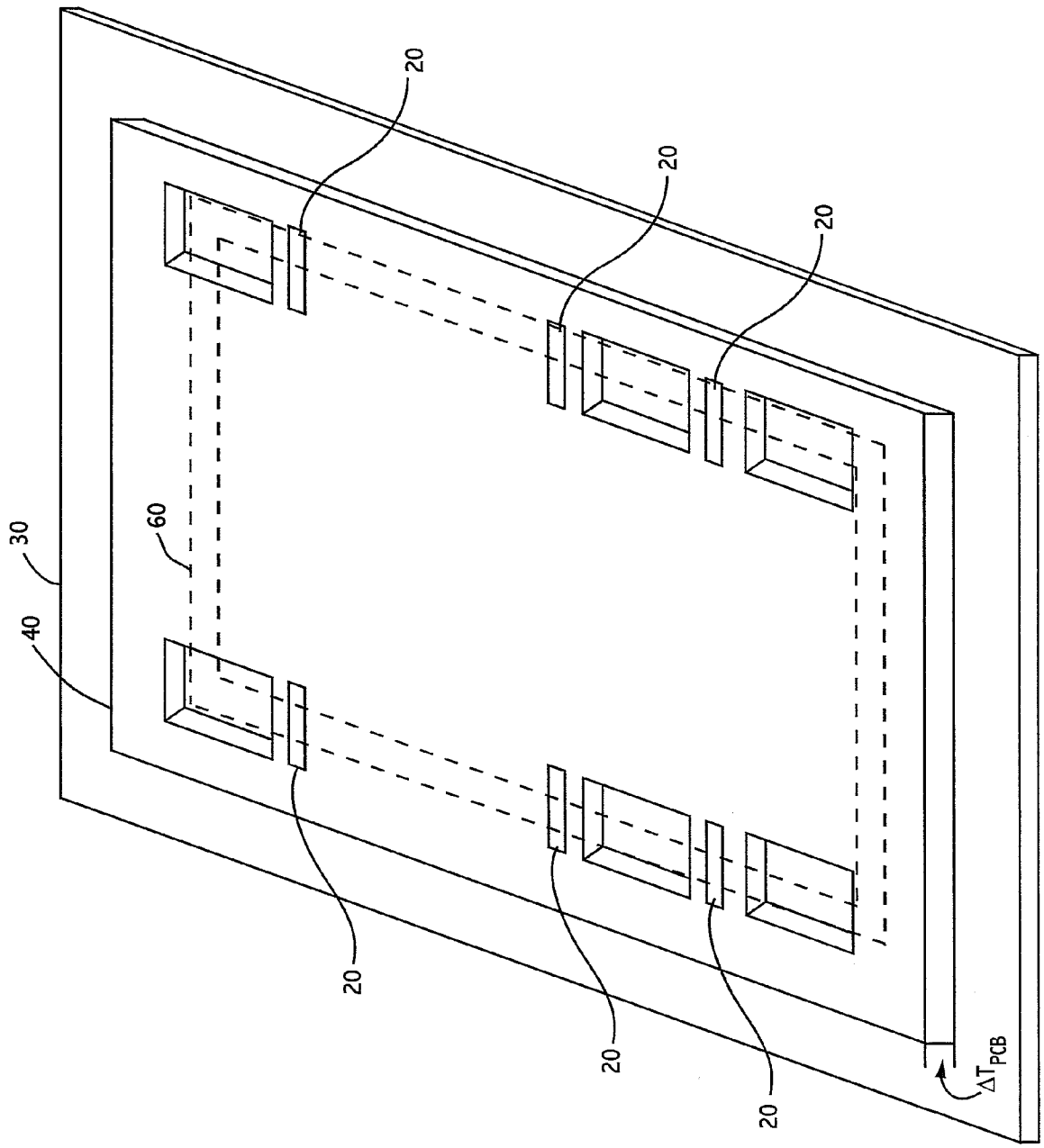
FIG. 2 shows an embodiment with a transmitter electrode of a particular shape.

In an alternative embodiment, the support plate 30 of the keyboard may be made of a non-conductive material and one or more discrete transmitter electrodes may be formed on (or at) a surface of the support plate. For example, in FIG. 2, the support plate 30 is shown to be made of a non-conductive material and a transmitter electrode 60 is shown to be formed on (or at) an upper surface of the support plate having a predetermined shape. In FIG. 2, the shape is a loop that overlaps corresponding ones of the receiver electrodes 20. In another embodiment, a plurality of transmitter electrode segments may be arranged in columns, rows or a matrix relative to the receiver electrodes.

Also, in FIG. 1, the receiver electrodes 20 are shown to correspond in number to a corresponding number of keys of the keyboard. In this arrangement, the receiver electrodes are associated with holes 25 in the printed circuit board, where each hole corresponds to or otherwise accommodates a respective key of the keyboard. In an alternative embodiment, one receiver electrode may be provided for the entire keyboard. Such a receiver electrode may be arranged in the form of a matrix with one or more corresponding transmitter electrodes arranged to overlap the receiver electrode.

Figure 3:
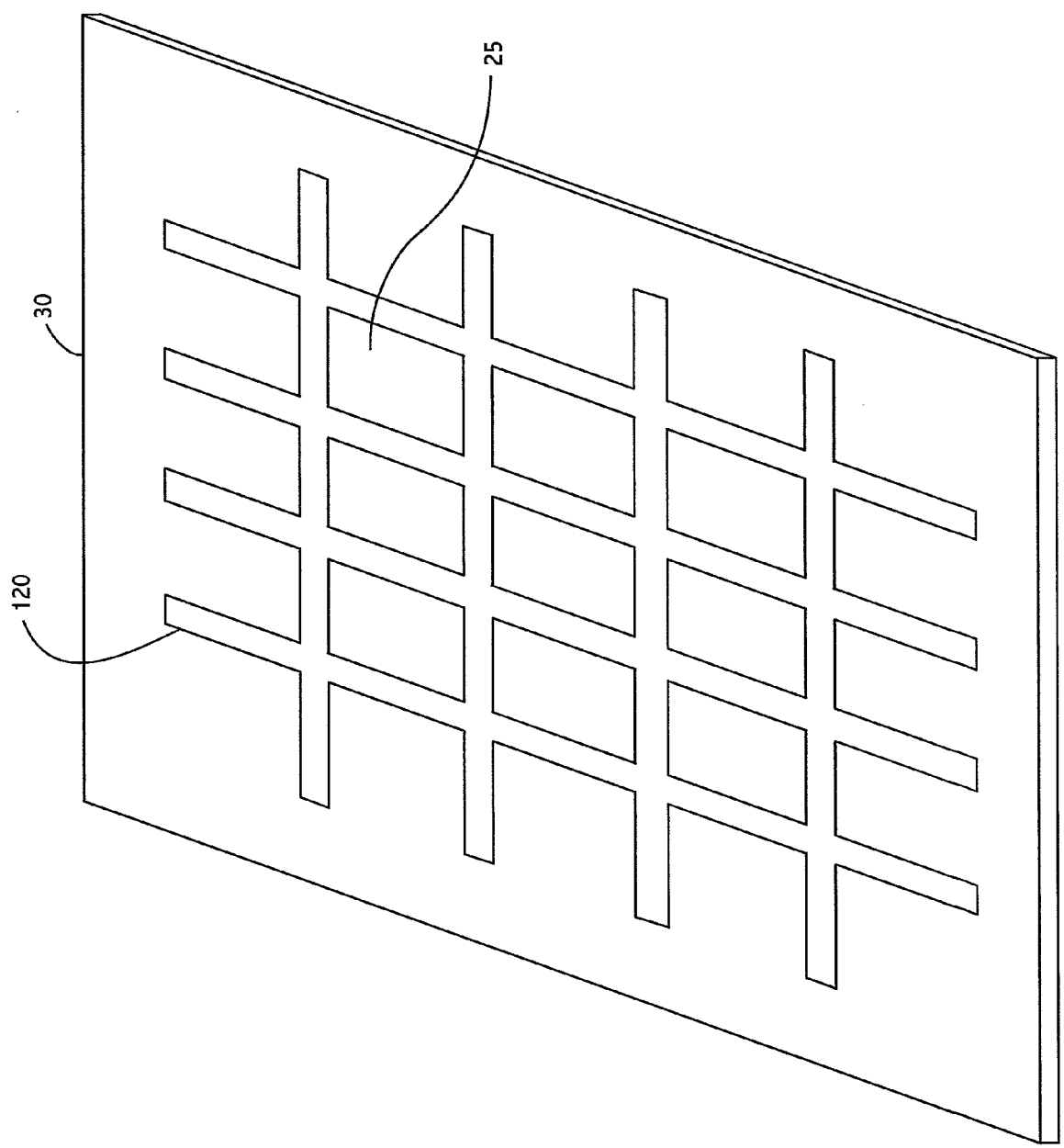
FIG. 3 shows an embodiment with a receiver electrode in a matrix shape.

FIG. 3 shows an example of this alternative arrangement where the receiver electrode 120 is arranged in a matrix and spaced above the metal support plate 30 of the keyboard. In a variation, the support plate may be made of a non-conductive material with one or more transmitter electrodes thereon. The transmitter electrode may even be the same or similar to the shape of the receiver electrode. The holes in the matrix-shaped receiver electrode may correspond to respective keys in the keyboard.

Returning to FIG. 1, the printed circuit board 40 may be placed directly on the metal support plate of the keyboard or may be separated from the metal support plate by one or more intervening layers. When the printed circuit board is in direct contact with the metal support plate of the keyboard, the separation distance between the transmitter electrode and the receiver electrodes includes or corresponds to a thickness ($\Delta T_{PCB}$) of the printed circuit board.

When the printed circuit board and metal support plate are separated by one or more intervening layers, the intervening layers may include a spacer layer, any one of a number of discrete spacer elements, and/or a non-conductive insulating layer. In this implementation, the transmitter electrode and receiver electrodes may be separated by a distance that includes a sum of the thickness of the printed circuit board ($\Delta T_{PCB}$) and the thickness of the one or more intervening layers ($\Delta T_{INT}$), or separation distance=$\Delta T_{PCB}+\Delta T_{INT}$.

The separation distance between the transmitter and receiver electrodes may determine the detecting range of the sensor. In accordance with one embodiment, the separation distance may be sufficient to generate a detecting range a predetermined distance above the keyboard so as to allow for proximity detecting and tracking of hand gestures within this range.

Figure 4:
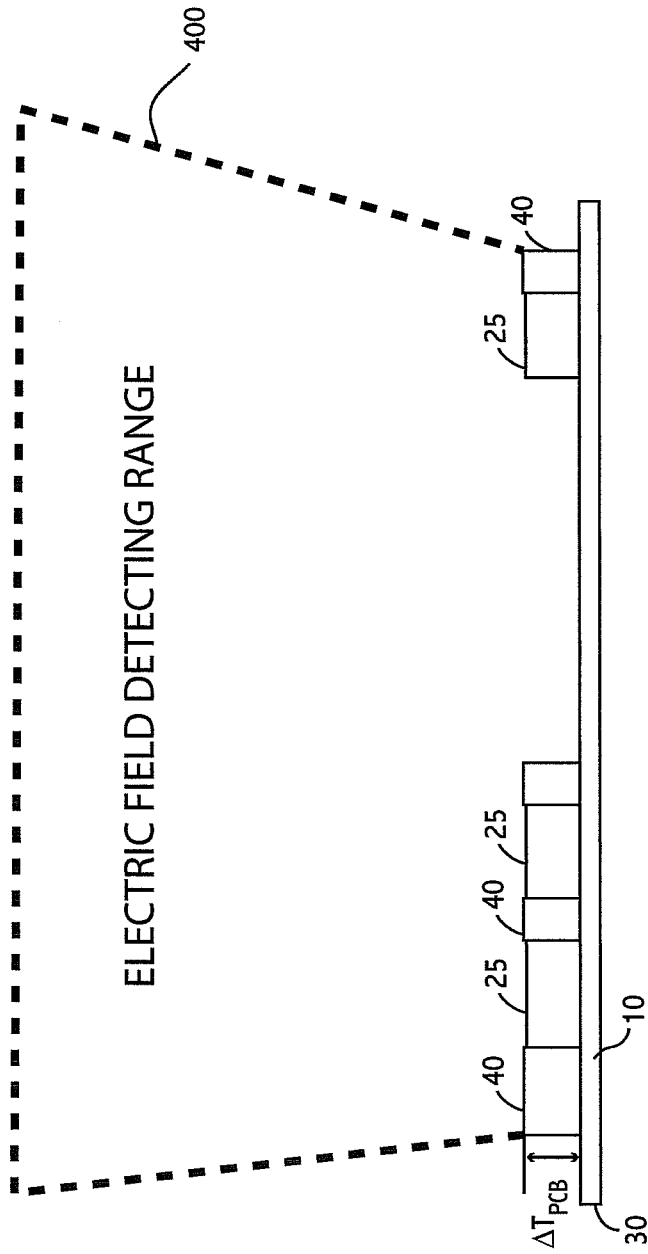
FIG. 4 shows an example of a detecting range of the sensor.

FIG. 4 shows an example of the detecting range established by the separation distance between the transmitter electrode 10 corresponding to metal support plate 30 and receiver electrodes formed on printed circuit board 40 containing holes 25. In this example, the keyboard corresponds to the one shown in FIG. 1 taken along sectional line A-A'.

Given this separation distance (which, in this case, corresponds to the thickness of the printed circuit board, $\Delta T_{PCB}$), an electric field is generated within a detecting range 400 located above the keyboard. The height of this range is determined by the separation distance and the width or lateral dimensions of this range are based on the region(s) of overlap between the transmitter and receiver electrodes.

| Separation Distance | Detecting Range Height |
|---|---|
| 0.5 mm | 3-4 cm |
| 1.0 mm | 5 cm |
| 1.6 mm | 8-10 cm |

In operation, disturbances in the electric field are detected by the receiver electrodes to perform operations related to proximity and hand tracking. In one embodiments, certain locations or movements of the hand or finger of a user may generate specific disturbances, or perturbances, in the electric field which are detected and compared to stored information to allow the location or movement to be identified. The stored information may be pre-stored in control and memory circuits in correspondence to one or more operations of a host device.

For example, a hand wave at a certain location relative to the keyboard within the detecting range may generate an electric field disturbance that corresponds to movement of a cursor or selection of an icon, menu item or other function relating to a cursor position. Another hand or finger gesture, movement, or location in the detecting range may turn on or off the host device, open a predetermined window or application, place a phone call (if the host device is a smart phone), or perform any of a number of other operations or functions preprogrammed into the device.

Figure 5:
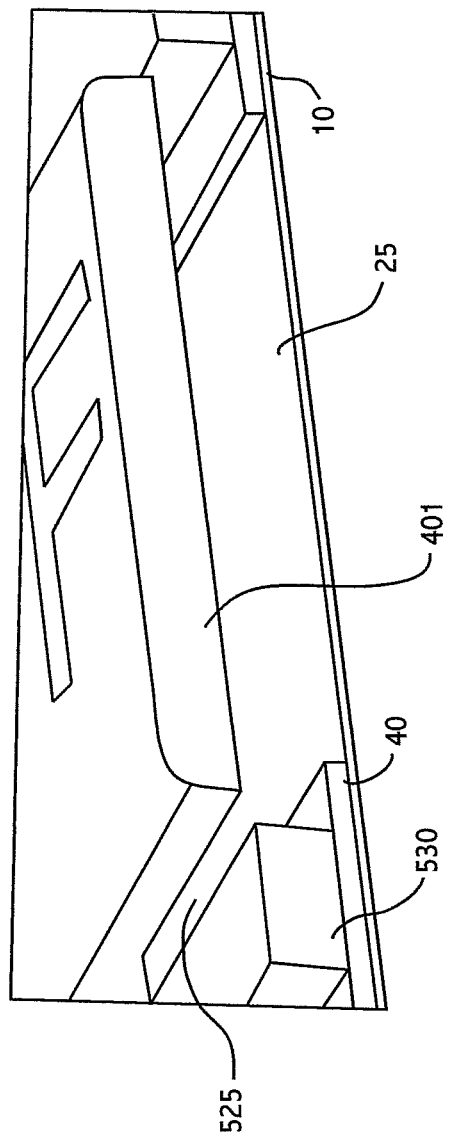
FIG. 5 shows sensor electrodes arranged in relation to a keyboard key.

FIG. 5 shows in cross-section an enlarged view of one key of the keyboard and how electrodes of the sensor may be arranged in relation to this key. In this cross-sectional diagram, the key 401 (which, in this illustrative example, corresponds to the letter "F") is provided to move reciprocally in and out of a hole 525 in a frame 530 of the keyboard. The keyboard frame is made of a non-conductive material in order to prevent interference or blockage of the formation of the electric field in the detecting range.

The keyboard frame is located over support plate 10 that corresponds to or includes one or more of the transmitter electrodes 10. If support plate 10 is the metal support plate of the keyboard, then the entire metal support plate may correspond to the transmitter electrode. The printed circuit board 40 includes the receiver electrodes, which may be located within or on a top surface of the printed circuit board and may be entirely or partially overlaid by the keyboard frame. The hole 525 of the frame is in alignment with a corresponding hole 40 in the printed circuit board.

Figure 6:
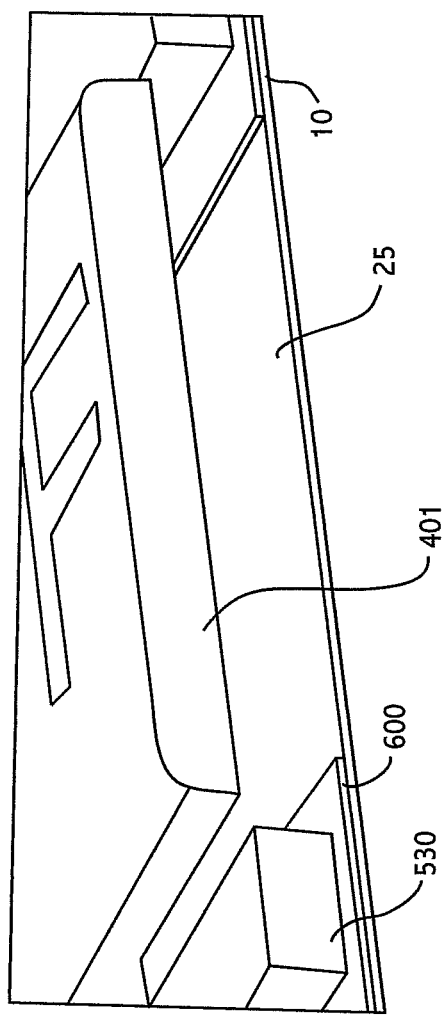
FIG. 6 shows another embodiment of sensor electrodes for a keyboard key.

FIG. 6 shows in cross-section an enlarged view of one key of the keyboard and how electrodes of the sensor may be arranged in relation to this key in another embodiment. This embodiment may be similar to the embodiment in FIG. 5 except that the printed circuit board is different. In FIG. 5, the printed circuit board is a rigid board; however, in FIG. 6 the printed circuit board is a flexible printed circuit board that is thinner than the circuit board of FIG. 5.

In accordance with one example, the flexible printed circuit board has a thickness of 0.15 mm. When the receiver electrodes are on (or at) a top surface of this flexible board, the smaller thickness of the board reduces the separation distance between the transmitter and receiver electrodes. As a result, the electric field detecting range may be smaller than in the case of FIG. 5. Because of this smaller range, this flexible printed circuit board embodiment may be especially appealing for use in smart phones, mobile terminals, gaming system controllers, and other devices of smaller size.

In other embodiments, the thickness of the printed circuit board may have a different value. For example, the flexible board may have a thickness at least substantially equal to a thickness of the underlying support plate of the keyboard. In other embodiments, the board may be thinner or a predetermined number of times thicker than the support plate.

Figure 7:
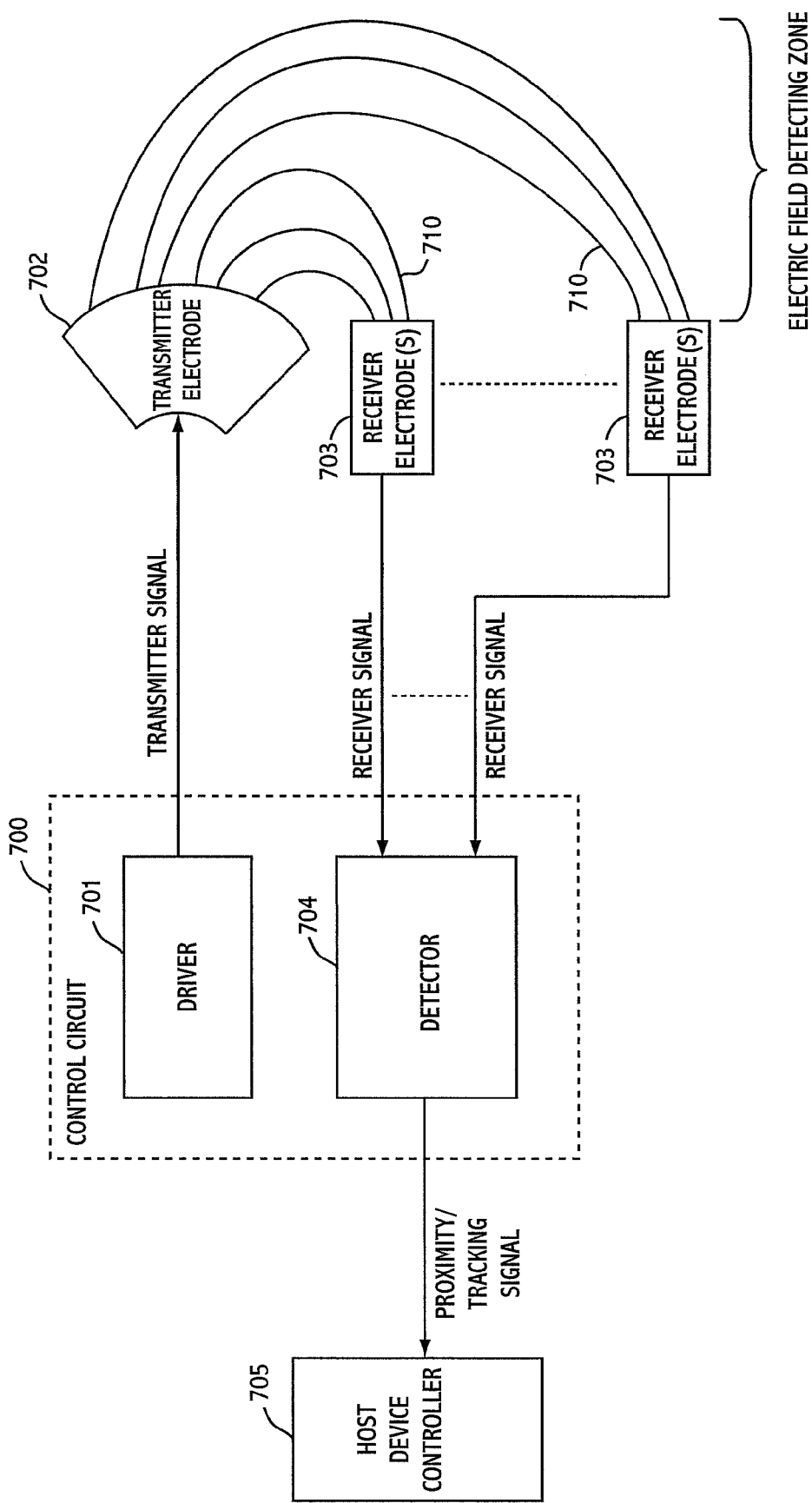
FIG. 7 shows a control circuit for a sensor having a single detecting zone.

FIG. 7 shows one possible control circuit 700 for the single transmitter-electrode embodiments of the sensor described herein. The control circuit may be included inside a housing of the keyboard or may be included in a housing of a host device to be operated based on signals from the keyboard and sensor. In one alternative embodiment, the keyboard and sensor may communicate with a controller of a host device over a wireless connection including but not limited to Bluetooth, WiFi or another wireless standard.

As shown in FIG. 7, the control circuit includes a driver 701 that generates a transmitter signal having a predetermined characteristic (e.g., a predetermined frequency, amplitude, modulation, and/or other properties). The transmitter signal is sent to the transmitter electrode 702 to generate an electric field within the detecting zone above the keyboard or other location where the transmitter and receiver electrodes are aligned.

The electric field generated by the transmitter electrode is received by one or more receiver electrodes 703 that are aligned with the transmitter electrode. The electric field extends between the transmitter electrode and respective ones of the receiver electrodes, as illustratively shown by field lines 710. Disturbances in the field lines (caused by the existence or movement of a hand or other object in the detecting range) are reflected in the receiver signals from the receiver electrodes, and a detector 704 generates a spectrum of the field after the disturbance is created.

The spectrum is used as a basis for forming a proximity or tracking signal, which is output to a controller of the host device. The host device includes a memory to store a predetermined relationship between different types of proximity or tracking signals and predetermined information, operations or functions to be performed on the host device.

Figure 8:
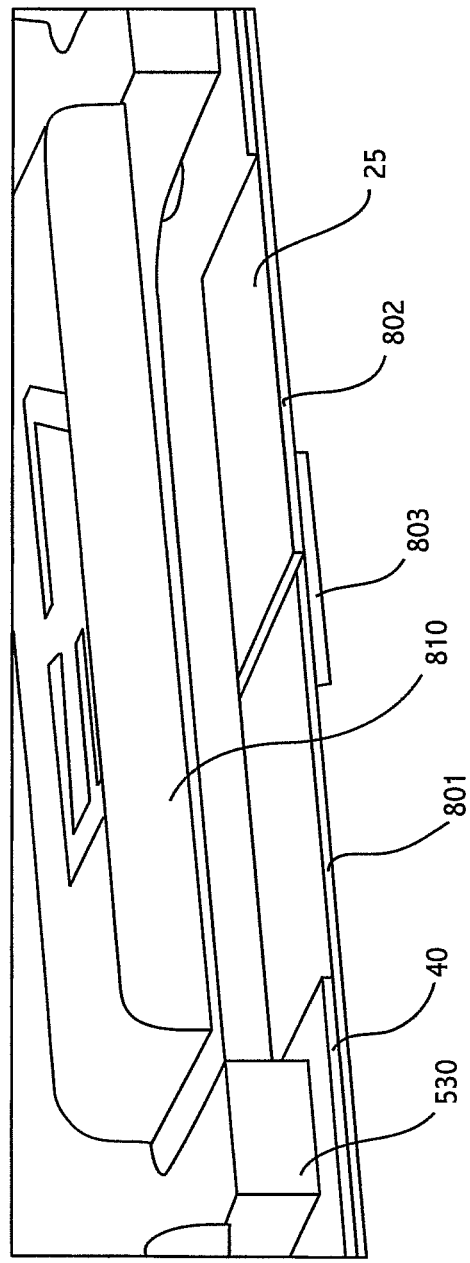
FIG. 8 shows an embodiment of a sensor with multiple detecting zones arranged relative to a same keyboard.

FIG. 8 shows an embodiment of a sensor with multiple electric field detecting zones arranged relative to a same keyboard. This embodiment has features similar to many of those previously described except that two transmitter electrodes 801 and 802 are provided for generating different detecting zones above the keyboard. The transmitter electrodes are spaced by at least a predetermined minimum distances in order to prevent a short between the electrodes.

According to one implementation, the keyboard support may correspond to two separated metal plates with the transmitter electrodes corresponding to respective ones of the plates. In the embodiment of FIG. 8, the metal support plates corresponding to the transmitter electrodes are supported and coupled in a predetermined orientation by another support 803, which may be made from metal or another material. A separation zone between the metal plates corresponding to the transmitter electrodes are shown as being in alignment with a key 810. However, in other embodiments, the separation zone between the metal transmitter electrode plates may be aligned with keyboard frame 530 or another feature of the keyboard.

The metal support plates corresponding to the transmitter electrodes 801 and 802 generate different detecting zones above the keyboard. When the plates are of the same size and dimensions, the detecting zones may have the same height or other dimensional attributes. When the plates are of different sizes (e.g., occupy different areas relative to the keyboard), the heights and/or lateral dimensions of the detecting zones may be different. Differences in the location or size of the detecting zones may also result from a different arrangement, number or location of receiver electrodes corresponding to respective ones of the transmitter electrodes. Thus, in effect, different detecting zones may have the same or different detecting ranges.

In order to prevent one zone from erroneously detecting the proximity or movement of a hand or other object in the other zones, the transmitter electrodes may be driven by different signals. The different signals may, for example, have different frequencies or modulations in order to allow the disturbances in respective ones of the zones from being distinguished based on signals from the receiver electrodes provided for those zones.

The multiple detecting zones may provide additional or enhanced functionality to the host electronic device including the keyboard. For example, hand proximity or movement in one zone may correspond to a first category of functions or operations and hand proximity or movement in the other zone may correspond to a second category of functions or operations of the host electronic device. Although two transmitter electrodes are shown in this embodiment, in other embodiments more than two transmitter electrodes may be provided relative to the keyboard in order to generate a commensurate number of detecting zones.

Figure 9:
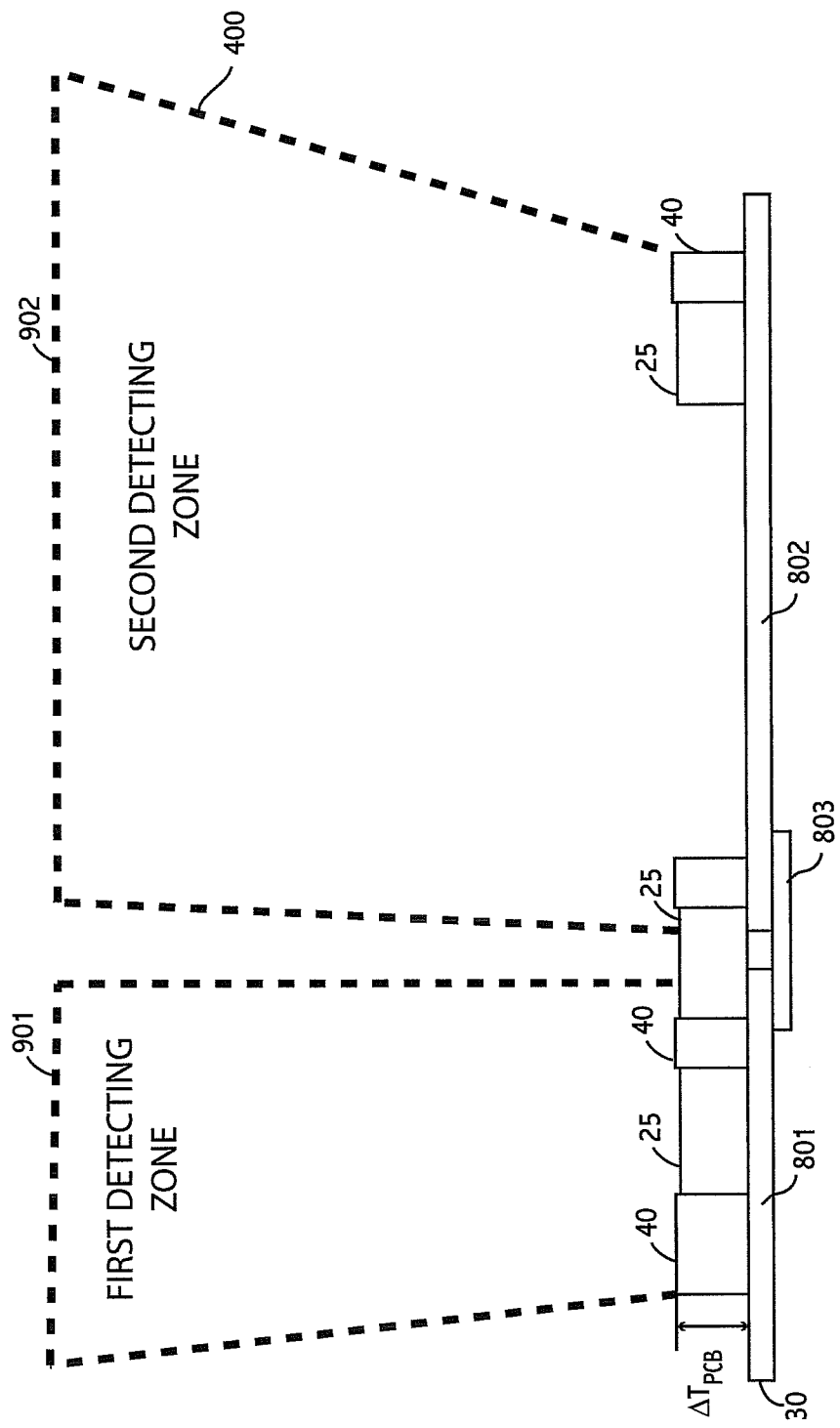
FIG. 9 shows an example of different detecting zones for a sensor with multiple transmitter electrodes.

FIG. 9 shows an example of different detecting zones that may be generated in a multiple transmitter-electrode embodiment. In this example, transmitter electrode 801 forms an electric field with corresponding receiver electrodes to form a first detecting zone 901 and transmitter electrode 802 forms an electric field with corresponding receiver electrodes to form a second detecting zone 902 over the keyboard. The detecting zones are shown to have different ranges, at least in terms of their lateral dimensions, as a result of the location and size of the transmitter electrodes. In other embodiments, these ranges may be the same or may be different from the example shown in FIG. 9.

Figure 10:
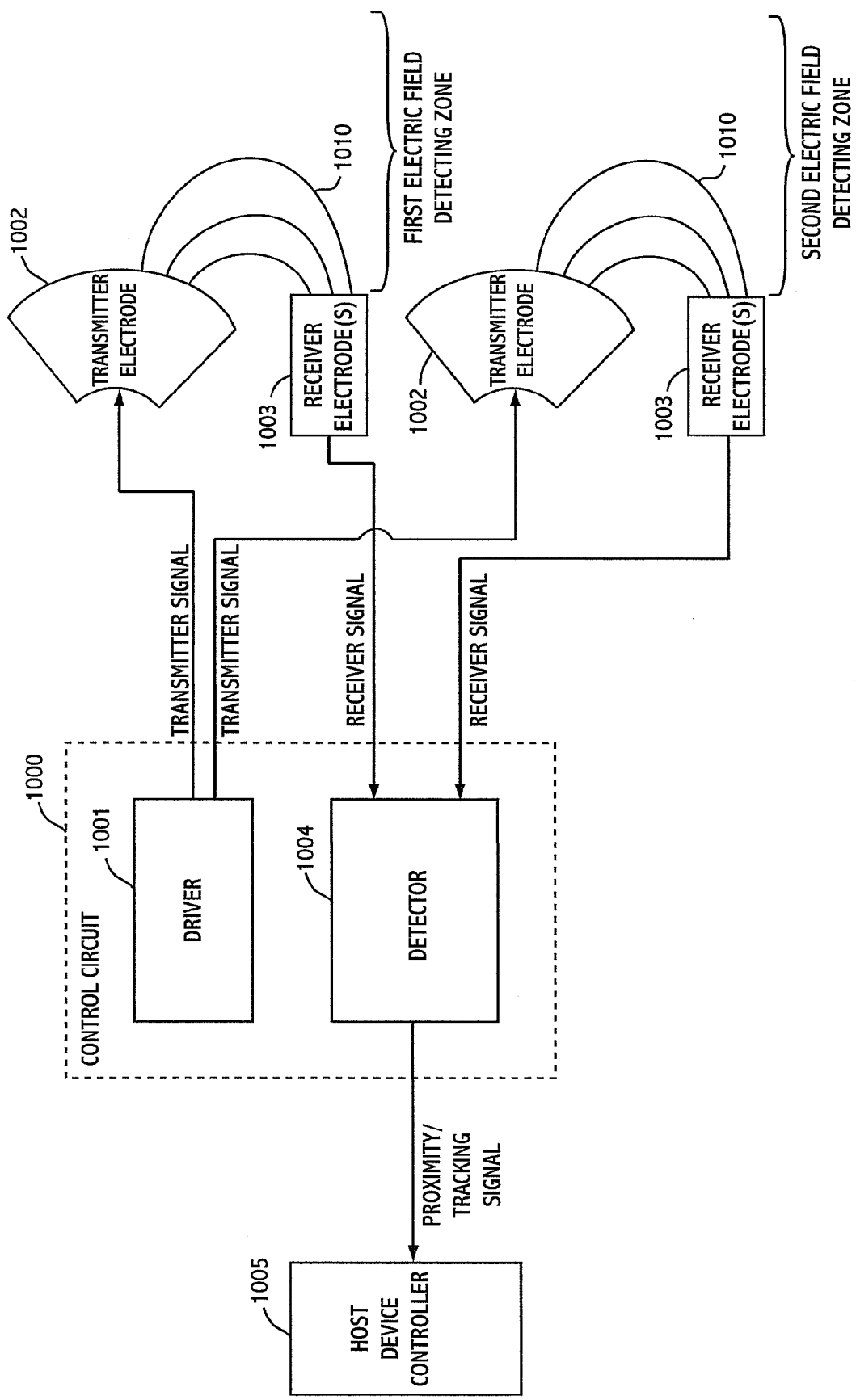
FIG. 10 shows a control circuit for a sensor having multiple transmitter electrodes with multiple detecting zones.

FIG. 10 shows one possible control circuit 1000 for a sensor having multiple detecting zones. The control circuit may be included inside a housing of the keyboard or may be included in a housing of a host device to be operated based on signals from the keyboard and sensor. In one alternative embodiment, the keyboard and sensor may communicate with a controller of a host device over a wireless connection including but not limited to Bluetooth, WiFi or another standard.

According to one implementation, control circuit 1000 includes a driver 1001 that generates a plurality of transmitter signals for respective ones of the transmitter electrodes 1002. The transmitter signals may have the same or different characteristic. According to one implementation, the transmitter signals for each transmitter electrode have different characteristics (e.g., a predetermined frequency, amplitude, modulation, and/or other properties) in order to improve detection ability and prevent errors in different detecting zones.

The transmitter signals sent to the transmitter electrodes generate electric fields within respective detecting zone above the keyboard. The field lines for each zone are respectively labeled 1010 and 1011. While the same driver is used for the transmitter electrodes in this implementation, in another implementation a different driver may be used for each transmitter electrode.

The electric field generated by each transmitter electrode is received by one or more receiver electrodes 1003 that are aligned with the transmitter electrode. The electric field extends between the transmitter electrode and respective ones of the receiver electrodes. Disturbances in the field lines (caused by the existence or movement of a hand or other object in the detecting range) are reflected in the receiver signals from the receiver electrodes, and a detector 1004 generates a spectrum of the field after the disturbance is created in each detecting zone.

The spectrum in each zone may be individually analyzed to map the proximity or movement of objects in the zone. The resulting proximity or tracking signal may then be output to the controller 1005 of the host device. Additionally, or alternatively, the spectrum for each zone may be processed into a single spectrum to generate an integrated proximity or tracking signal for output to the host device controller. The host device includes a memory to store a predetermined relationship between different types of proximity or tracking signals and predetermined information, operations or functions to be performed on the host device.

Figure 11:
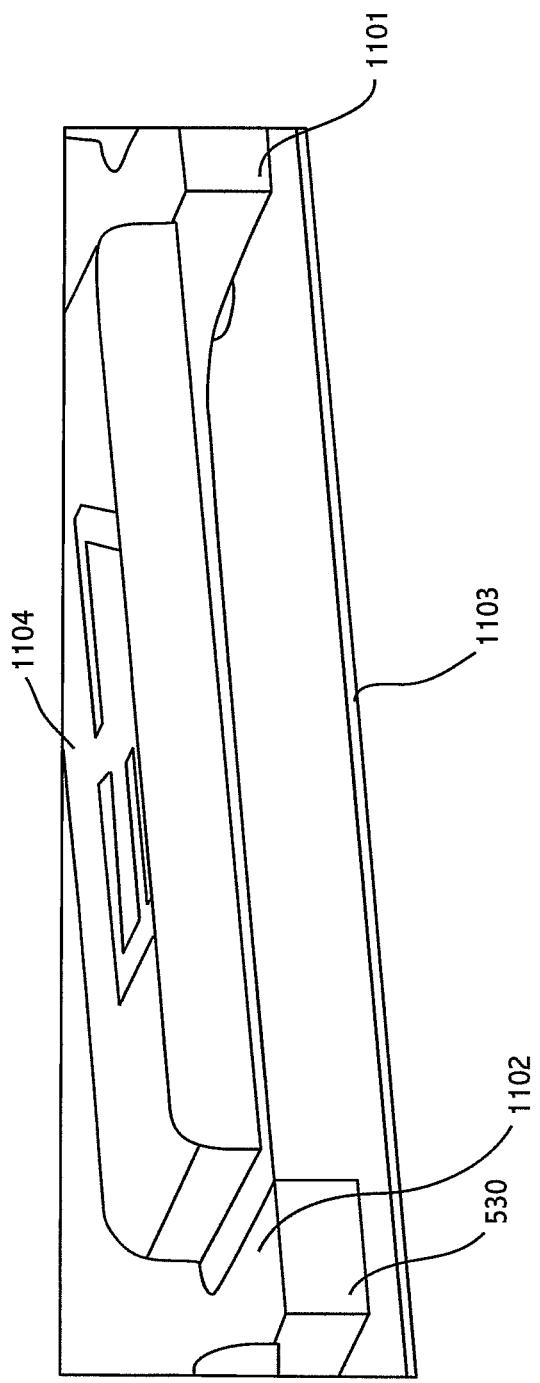
FIG. 11 shows another embodiment of an electric field sensor for a keyboard.

FIG. 11 shows another embodiment of a sensor for tracking the proximity and/or movement of a hand or other object in a detecting zone relative to a keyboard. This embodiment includes a key 1104 that moves reciprocally in and out of a hole in keyboard frame 530. This embodiment also includes a support plate 1103. However, unlike previous embodiments, the transmitter electrode 1101 and the receiver electrode(s) 1102 are formed from conductive paint.

In accordance with one implementation, the painted transmitter electrode 1101 is formed on a bottom surface of the keyboard frame 530 and the receiver electrode(s) are formed on a top surface of this same frame. The separation distance between the transmitter and receiver electrodes in this implementation may correspond to the thickness of the keyboard frame. In this implementation, the support plate 1103 may be made of metal and therefore is no printed circuit board between the keyboard frame and the support plate. Pads, leads, or other conductive connections may couple the transmitter and receiver electrodes to drive and detect circuitry.

In another implementation of this embodiment, the support plate 1103 may be made of a non-conductive material and the conductive paint corresponding to the transmitter electrode may be applied to the support plate. In either of the aforementioned implementations, conductive paint may be continuously applied to all or a portion of a predetermined area of the top surface of the keyboard frame to form a receiver electrode, or discrete areas of the top surface of the keyboard frame may be painted with conductive paint to form a corresponding number of receiver electrodes.

Also, the bottom surface of the keyboard frame (or alternatively, the top surface of a non-conductive support plate) may be coated with conductive paint, either continuously to form a single transmitter electrode with one detecting zone above a corresponding location of the keyboard or in discrete areas to form multiple separated transmitter electrodes to form multiple detecting zones. Because the printed circuit board is eliminated in these embodiments, a thinner keyboard may be provided with the electric field proximity/tracking sensor.

While the sensor in FIG. 11 is shown to correspond to one or more keys of a keyboard, in an alternative implementation the conductive paint may be applied to other non-conductive surfaces of the keyboard, keyboard frame, and/or even the housing of the host electronic device that includes the keyboard. For example, conductive paint may be applied to a corner of the keyboard frame which is made from a non-conductive material. By coating the top and bottom surfaces of one or more keyboard corners (where no keys are located)

with conductive paint to form the transmitter and receiver electrodes, a different or additional detecting zone may be formed.

Additionally, or alternatively, different surfaces of the non-conductive frame of a notebook, pad-type, pod-type, or personal computer (PC) chassis may be coated with conductive paint to form an electric field proximity/tracking sensor for performing various functions of the PC.

In the foregoing implementations, the conductive paint may be transparent or a particular color to be non-visible to the eye or another color paint may be applied over the conductive paint on the top surface of the keyboard frame or chassis to blend in or otherwise hide the electrode(s). Additionally, or alternatively, one or more non-conductive protective coatings or structures may be applied over the conductive paint to prolong the useful life of the electrodes and/or prevent them from damage during use.

Also, as described herein, the conductive paint previously discussed may be understood to include a conductive layer of paint, a conductive ink, a conductive powder, or a conductive film.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Also, the features of any one embodiment described herein may be combined with the features of one or more other embodiments to form additional embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. An apparatus comprising:
a first electrode to transmit a signal; and
at least one second electrode to receive the signal, wherein:
the first electrode to transmit the signal is located on a first level of a keyboard assembly,
a second electrode to receive the transmitter signal is located on a second level of the keyboard assembly, the second level being different than the first level,
transmission of the signal from the first electrode to the second electrode is to generate an electric field within a first detecting zone above at least one key of the keyboard assembly between the first and second electrodes, the electric field to be generated within the first detecting zone above the keyboard assembly based on a distance between the first electrode on the first level and the second electrode on the second level, wherein:
the second electrode to receive the transmitter signal is located adjacent at least one key of the keyboard assembly, and
the first electrode to transmit the transmitter signal is located at least partially under the at least one key and the second electrode, wherein the first electrode to transmit the transmitter signal is at a metal support plate of the keyboard assembly and the second electrode to receive the transmitter signal is at a printed circuit board of the keyboard assembly above the support plate.

2. The apparatus of claim 1, wherein the electric field between the first and second electrodes is to correspond to the first detecting range to detect proximity or movement of an object above the keyboard assembly.

3. The apparatus of claim 1, wherein the first level is to correspond to the support plate of the keyboard assembly and a second level is to correspond to a surface of the keyboard assembly above the support plate.

4. The apparatus of claim 1, wherein the first electrode to transmit the transmitter signal is at a surface of the support plate and the second electrode to receive the transmitter signal is located above the support plate.

5. The apparatus of claim 1, wherein the distance between the first electrode and the second electrode corresponds to a thickness of a printed circuit board to which the second electrode is coupled.

6. The apparatus of claim 1, further comprising:
a third electrode to transmit a transmitter signal; and
at least one fourth electrode to receive the transmitter signal, wherein:
transmission of the signal from the third electrode to the fourth electrode is to generate an electric field between the third and fourth electrodes,
the electric field between the first and second electrodes is to correspond to the first detecting range to detect proximity or movement of an object above the keyboard assembly, and
the electric field between the third and fourth electrodes is to correspond to a second detecting range to detect proximity or movement of the same or another object above the keyboard assembly.

7. The apparatus of claim 6, wherein the first detecting range is different from the second detecting range.

8. The apparatus of claim 6, wherein the first detecting range is based on a size of the first electrode.

9. A keyboard assembly comprising:
at least one key;
a first electrode to transmit a transmitter signal; and
at least one second electrode to receive the transmitter signal, wherein:
the first electrode to transmit the transmitter signal is located at least partially under the second electrode to receive the transmitter signal and at least partially under the at least one key,
a second electrode to receive the transmitter signal is at the at least one key, the first electrode to transmit the transmitter signal corresponds to a metal support plate of the keyboard assembly and the second electrode to receive the transmitter signal is coupled to a surface of the keyboard assembly above the support plate, and the surface to which the second electrode is coupled is a surface of a printed circuit board above the metal support plate, and transmission of the signal from the first electrode to the second electrode is to generate an electric field at a first detecting zone between the first and second electrodes and above the at least one key, the electric field to be generated at the first detecting zone above the keyboard assembly based on a distance between the first electrode at least partially under the second electrode and the second electrode.

10. The keyboard assembly of claim 9, wherein the electric field between the first and second electrodes is to correspond to the first detecting range to detect proximity or movement of an object above the keyboard assembly.

11. The keyboard assembly of claim 9, wherein the distance between the first and second electrodes corresponds to a thickness of a printed circuit board to which the second electrode is coupled.

12. The keyboard assembly of claim 9, wherein the electric field between the first and second electrodes is to extend above the at least one key of the keyboard assembly.

13. The keyboard assembly of claim 9, wherein:
the at least one key extends through a hole in a printed circuit board,
the first electrode is located under the hole, and
the second electrode is coupled to a location of the printed circuit board adjacent the hole.

14. An apparatus comprising:
a first electrode to transmit a transmitter signal; and
at least one second electrode to receive the transmitter signal, wherein:
the first electrode to transmit the signal is located on a first level of a keyboard assembly,
a second electrode to receive the transmitter signal is located on a second level of the keyboard assembly, the second level being different than the first level,
transmission of the signal from the first electrode to the second electrode is to generate an electric field within a first detecting zone above at least one key of the keyboard assembly between the first and second electrodes, the electric field to be generated within the first detecting zone above the keyboard assembly based on a distance between the first electrode on the first level and the second electrode on the second level, wherein:
the second electrode to receive the transmitter signal is located adjacent at least one key of the keyboard assembly, and
the first electrode to transmit the transmitter signal is located at least partially under the at least one key and the second electrode,
the first electrode is a conductive layer at a first surface of a frame of the keyboard assembly, and the second electrode is a conductive layer at a second surface of the frame of the keyboard assembly, the frame formed of a non-conductive material, wherein the first conductive layer is a conductive paint layer at a first surface of the frame of the keyboard assembly, and the second conductive layer is a conductive paint layer at a second surface of the frame of the keyboard assembly.

\* \* \* \* \*